United States Patent [19]

Aoshima et al.

[11] Patent Number: 4,973,900
[45] Date of Patent: Nov. 27, 1990

[54] VOLTAGE DETECTING DEVICE

[75] Inventors: Shinichiro Aoshima; Yutaka Tsuchiya; Takuya Nakamura, all of Shizuoka, Japan

[73] Assignee: Hamamatsu Photonics K.K., Shizuoka, Japan

[21] Appl. No.: 200,972

[22] Filed: Jun. 1, 1988

[30] Foreign Application Priority Data

Jun. 10, 1987 [JP] Japan .................................. 62-144981

[51] Int. Cl.⁵ ..................... G01R 19/00; G01R 31/00; G02F 1/09
[52] U.S. Cl. ................................. 324/96; 324/121 R; 350/356
[58] Field of Search ................. 324/96, 117 R, 121 R; 350/356, 374, 376, 401, 402; 356/368

[56] References Cited

U.S. PATENT DOCUMENTS

| 3,335,367 | 8/1967 | Skooglund et al. | 324/96 |
| 3,447,855 | 6/1969 | Skinner | 350/356 |
| 3,485,553 | 12/1969 | Lee | 350/356 |
| 3,623,795 | 11/1971 | Taylor et al. | 350/356 |
| 4,425,024 | 1/1984 | Keil et al. | 350/358 |
| 4,920,310 | 4/1990 | Aoshima et al. | 324/96 |

Primary Examiner—Ernest F. Karlsen
Attorney, Agent, or Firm—Finnegan, Henderson, Farabow, Garrett, and Dunner

[57] ABSTRACT

A voltage detecting device using an electro-optical material with a refractive index that is changed by a voltage at a part of an object comprising a light source, an electro-optical material for changing the optical path of the light beam from the light source in accordance with the refractive index of the electro-optical material, and a streak camera to display on a Phosphor screen an image of the voltage over time at a part of the object.

10 Claims, 6 Drawing Sheets

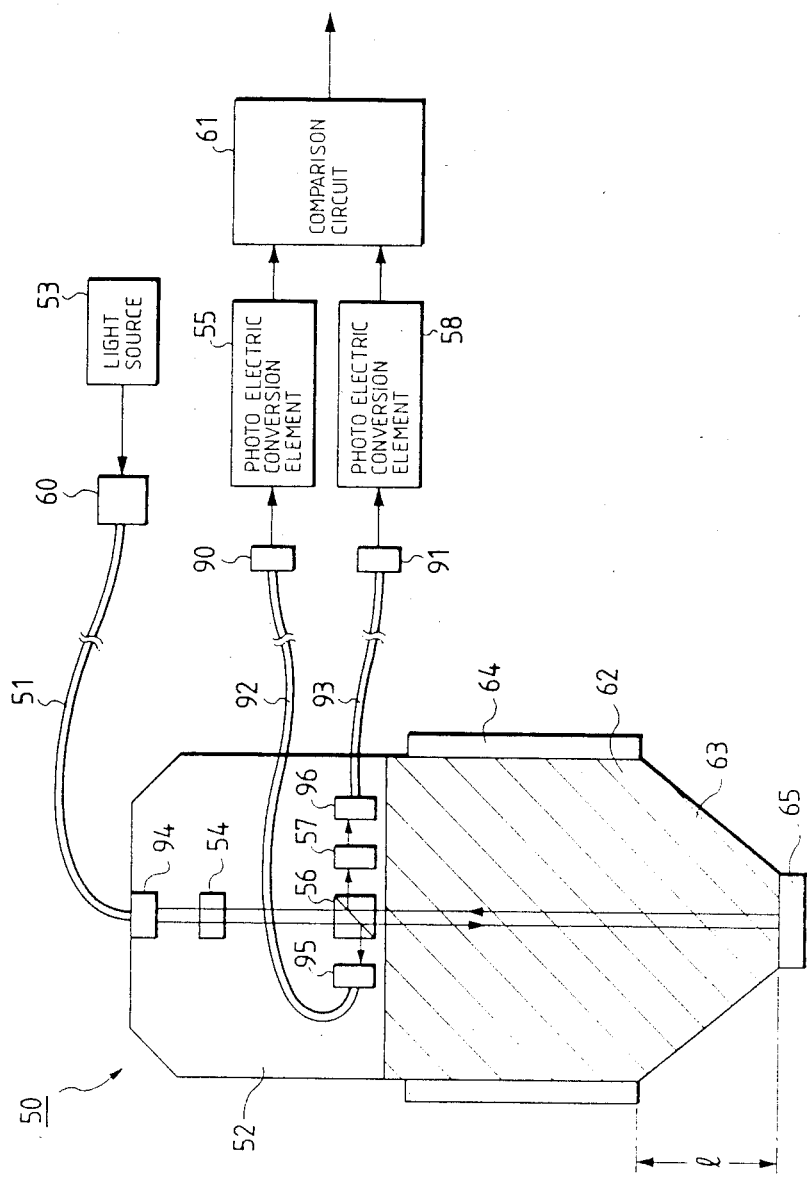

VOLTAGE DETECTING DEVICE

FIELD OF THE INVENTION

This invention relates to a voltage detecting device for detecting the voltage of a predetermined part of an object under measurement such as an electrical circuit, and more particularly to a voltage detecting device that operates on the fact that the refractive index of an electro-optical material depends on the voltage of a predetermined part of the object under measurement.

BACKGROUND OF THE INVENTION

A variety of voltage detecting devices have been employed to detect the voltage of a predetermined part of an object such as an electrical circuit. In one example of a voltage detecting device of this type, a probe is brought into contact with a predetermined part of the object to detect the voltage thereof. In another example, the probe is held away from the predetermined part of the object and an electron beam is applied to the predetermined part to detect the voltage thereof.

There has been a strong demand for the provision of a method of detecting the voltage of a part or all of a small object, such as a small integrated circuit, with high accuracy but without affecting the condition of the minute object. A voltage detecting device that uses a contact probe is disadvantageous for this purpose for several reasons. First, it is rather difficult to bring the probe into contact with a part of a small object, e.g., an integrated circuit or the like. Moreover, even if it were possible to do so, it would be difficult to analyze the operation of the integrated circuit correctly only from voltage data obtained in this way. Furthermore, the operating conditions of the integrated circuit would be changed by contact with the probe.

The voltage detecting device that uses an electron beam can detect a voltage when the probe is held away from an object under measurement, but it also suffers from several problems. For example, the part to be measured must be exposed in a vacuum, said also the part may be damaged by the electron beam.

Furthermore, in the conventional voltage detecting devices, the operation speed of the detector has not been able to follow a voltage that changes rapidly. Therefore, conventional voltage detecting devices are further disadvantageous in the instance of a voltage that is quickly changing, for instance in integrated circuits.

In order to solve the above-described problems, a voltage detecting device operating on the fact that the polarization of a light beam is changed by the voltage of a predetermined part of an object under measurement has been described in unpublished Japanese patent application number 137317/87 filed by the present applicant on May 30, 1987. FIG. 8 is a diagram showing the arrangement of the that voltage detecting device.

As shown in FIG. 8, the voltage detecting device 50 comprises an optical probe 52, a CW light source 53 (including for instance a laser diode), an optical fiber 51 for guiding a light beam from the light source 53 through a condenser lens 60 to the optical probe 52, an optical fiber 92 for conducting a reference light beam from the optical probe 52 through a collimator 90 to a photo-electric conversion element 55, an optical fiber 93 for applying an emergent light beam from the optical probe 52 through a collimator 91 to a photo-electric conversion element 58, and a comparison circuit 61 in which the output electrical signal of the photo-electric conversion elements 55 and 58 are subject to comparison.

Electro-optical material 62 such as an optically uniaxial crystal of lithium tantalate (LiTaO$_3$) is enclosed in the optical probe 52. The end portion 63 of the optical probe 52 is in the form of a circular truncated cone. A conductive electrode 64 is formed on the cylindrical wall of the optical probe 52. A reflecting mirror 65 made of a metal film or dielectric multi-layer film is provided on the end face of the end portion 63 of the optical probe 52.

Provided in the optical probe 52 are a collimator 94, condenser lenses 95 and 96, a polarizer 54 for extracting only a light beam having a predetermined polarization component out of a light beam outputted by the collimator 94, and a beam splitter 56. The beam splitter 56 divides the light beam having the predetermined polarization component, which is provided by the polarizer 54, into a reference light beam and an incident light beam, and applies an emergent light beam from the electrooptical material 62 to an analyzer 57. The reference light beam and the emergent light beam are applied to the optical fibers 92 and 93 through the condenser lenses 95 and 96, respectively.

In performing voltage detection with the voltage detecting device thus organized, the conductive electrode 64 formed on the cylindrical wall of the optical probe 52 is normally grounded. Under this condition, the head 63 of the optical probe 52 is set close to an object under measurement, such as an area of an integrated circuit (not shown). As a result, the refractive index of the head 63 of the electro-optical material 62 in the optical probe 52 will be changed. More specifically, in an optically uniaxial crystal, the difference between the refractive index of an ordinary ray beam and that of an extraordinary ray beam in a plane perpendicular to the optical axis is changed.

The output light beam of the light source 53 is applied through the condenser lens 60, the optical fiber 51 and the collimator 94 to the polarizer 54, which provides a light beam having the predetermined polarization component and being an intensity equal to I. The output light beam of the polarizer 54 is applied through the beam splitter 56 to the electro-optical material 62 in the optical probe 52. The reference light beam and the incident light beam divided by the beam splitter 56 are I/2 in intensity. As was described above, the refractive index of the electro-optical material 62 is changed by the voltage of an object under measurement. Therefore, the incident light beam applied to the electro-optical material 62 is changed in polarization at the head 63 depending on the change in refractive index, and is then reflected by the reflecting mirror 65, so that it is applied, as the emergent light beam from the electro-optical material 62, to the beam splitter 56. The polarization of the incident light beam is changed in proportion both to the difference in refractive index between the ordinary ray and the extraordinary ray due to the presence of a voltage, and to a value 2l where l is the length of the head 63 of the electro-optical material 62.

The emergent light beam is applied to the analyzer 57 by the beam splitter 56. The intensity of the emergent light beam applied to the analyzer 57 is reduced to I/4 by the beam splitter 56. If the analyzer 57 is designed to transmit only a light beam having a polarization component perpendicular to the polarization component of the polarizer 54, then the intensity I/4 of the emergent light beam applied to the analyzer 57 is changed to $(I/4)\sin^2((\pi/2)\cdot V/V_O)$ by the analyzer 57 before being applied to the photo-electric conversion element 58, V is the voltage of the object under measurement, and VO is the half-wavelength voltage.

In the comparison circuit 61, the intensity I/2 of the reference light beam subject to photo-electric conversion by the photo-electric conversion element 55 is compared with the intensity $(I/4)\sin^2((\pi/2)\cdot V/V_O)$ of the emergent light beam subjected to photo-electric conversion by the photo-electric conversion element 58.

The intensity $(I/4)\sin^2((\pi/2)\cdot V/V_O)$ of the emergent light beam depends on the change in refractive index of the head 63 of the electro-optical material 62 which is due to the variation of voltage. Therefore, the voltage of a predetermined part of an object under measurement, such as an area of an integrated circuit, can be detected from the light intensity.

As was described above, the voltage detecting device 50 of FIG. 8 is designed so that the voltage of a predetermined part of an object under measurement is detected from the change in refractive index of the end portion 63 of the electro-optical material 62 which is caused when the end portion 63 of the optical probe 52 approaches the object. Therefore, with the device, the voltage of a small part of an integrated circuit which is difficult for the probe to contact or is affected in the voltage when contacted by the probe can be detected when the optical probe 52 is held a small distance away from the area to be measured. Furthermore, a pulse light source such as a laser diode that outputs an optical pulse with an extremely short pulse width may be employed to sample quick voltage changes of an object which occur at considerably short time intervals. A CW light source and a high-speed response detector such as a streak camera, may be used to measure the rapid voltage change of the object with high time resolution. In that case, the quick voltage change can be detected with high accuracy.

However, the voltage detecting device 50 of FIG. 8 suffers from some difficulties. The device detects the voltage of a predetermined part of an object under measurement from the variation in polarization of the light beam in the electro-optical material 62. Therefore, it is necessary to extract only the light beam having the predetermined polarization component from the output light beam of the light source 53 with the aid of the polarizer 54 and to extract the predetermined linear polarization component from the emergent light beam from the electro-optical material 62 with the aid of the analyzer 57. Consequently, the device suffers from low utilization. Furthermore, the device uses the beam splitter 56 which causes the intensity of the emergent light beam applied to the analyzer 57 to be lower than that of the light beam outputted by the light source 53. As a result, the voltage detection accuracy of the detector is unduly limited. Moreover, the device requires a large number of components, such as the polarizer 54, the analyzer 57, and the beam splitter 56, which causes the improvement in accuracy of the optical system to be limited.

If instead of the photo-electric conversion elements, a streak camera is employed as the detector, the variation of voltage of the predetermined part of the object under measurement is detected in the form of a one-dimensional optical intensity distribution on the phosphor screen of the streak camera. In order to obtain the waveform of the voltage, it is necessary to analyze the one-dimensional optical intensity distribution on the phosphor screen of the streak camera. In addition, in the method of detecting of the voltage of a predetermined part of an object under measurement from the change of polarization, only the absolute value of voltage is detected, and it is impossible to detect the polarity of the voltage. In other words, it is impossible to determine whether the voltage is positive or negative.

SUMMARY OF THE INVENTION

Accordingly, an object of the invention is a voltage detecting device that can directly detect the waveform of a voltage, especially a pulse voltage, in a predetermined part of an object under measurement with a simple optical system.

A further object of the present invention is a voltage detecting device that indicates the change over time of the voltage at a predetermined part of an object under measurement.

These and other objects are accomplished by a voltage detecting device for detecting and measuring a voltage at a predetermined part of an object under measurement comprising a light source for outputting a light beam; optical path changing means adapted to be placed closely spaced to the predetermined part of the object, the optical path changing means being made of electro-optical material having a refractive index that is changed by the presence of a voltage, the optical path changing means for allowing the light beam outputted by the light source to advance along an optical path corresponding to the refractive index of the electro-optical material, means for detecting the light beam upon emergence thereof from the optical path changing means and for displaying in response to the detected light beam an image indicating the voltage at the predetermined part of the object, and guiding means for conveying the light beam from the optical path changing means to the detecting means.

IN THE DRAWINGS

The manner by which the above objects and other objects, features, and advantages of the present invention are achieved will be apparent from the following detailed description when considered in view of the drawings, wherein:

FIG. 8 is an explanatory diagram showing the arrangement of a conventional voltage detecting device.

DETAILED DESCRIPTION

A voltage detecting device according to the invention, includes a light source for outputting a light beam, an optical path changing means made of electro-optical material for allowing the light beam outputted by the light source to advance along an optical path corresponding to the reflective index of the electro-optical material, and guiding means for introducing a light beam from the optical path changing means to the detecting means.

In the voltage detecting device of the present invention, the output light beam of the light source is applied to an optical path changing means such as a dispersion prism. The light beam applied to the optical path changing means is allowed to advance along the optical path defined by the refractive index of the optical path changing means, and to emerge therefrom as a transmitted light beam or reflected light beam. The refractive index of the optical path changing means changes with the voltage applied to the predetermined part of the object, as a result of which the optical path of the transmitted light beam or reflected light beam is changed. On the output side of the optical path changing means, the guiding means, such as a plurality of optical fibers, are provided for the optical paths so that the detecting means such as a streak camera, detects in a parallel mode the transmitted light beams or reflected light beams applied through the optical paths. Therefore, the voltage applied to the predetermined part of the object can be detected as a voltage waveform with the voltage detecting device. Furthermore, in this operation, the positive or negative polarity of the voltage can be detected.

Figure 1:
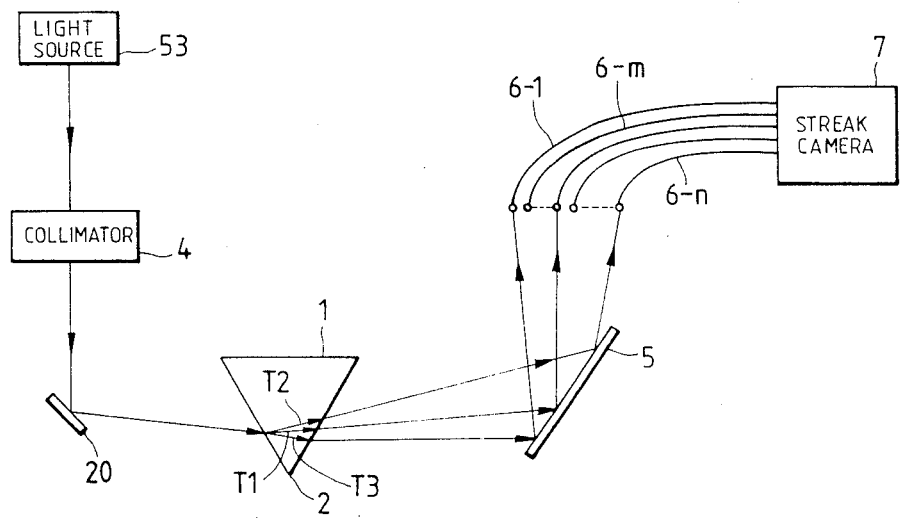
FIG. 1 is an explanatory diagram showing an arrangement of a first example of a voltage detecting device according to the present invention.

FIG. 1 is an explanatory diagram showing the arrangement of a part of one example of a voltage detecting device according to the present invention. The voltage detecting device, as shown in FIG. 1, comprises an optical path changing means such as a dispersion prism 1 of electro-optical material, e.g., optically uniaxial crystal lithium tantalate ($LiTaO_3$). In operation, the end 2 of the prism 1 is set close to an object under measurement so that the refractive index of the prism 1 is changed by the voltage of that predetermined part of the object.

Figure 2:
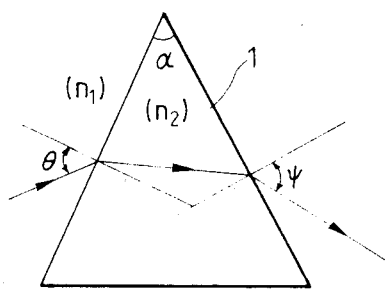
FIG. 2 is an explanatory diagram for a description of the optical path of a dispersion prism of the device of FIG. 1.

An incident light beam outputted by a light source 53, which is a CW laser such as a He-Ne laser or semiconductor laser, is applied through a collimator 4 and is directed by a mirror 20 to the dispersion prism 1. The incident light beam is allowed to advance along an optical path determined according to the refractive index of the dispersion prism 1, and emerge, as a transmitted light beam, from the dispersion prism 1. In this connection, it is assumed that, as shown in FIG. 2, the space through which the incident light beam passes before entering the dispersion prism 1 has a refractive index $n_1$, the dispersion prism 1 has a refractive index $n_2$, and the incident light beam forms an angle $\theta$ with the normal to the incident surface of the dispersion prism 1 upon incidence. In this case, the transmitted light beam emerges from the dispersion prism 1 at an angle $\psi$ which is defined by the following equation (1):

$$\sin \psi = \sin \theta \overline{\sqrt{n^2 - \sin^2 \theta}} \cdot \cos \alpha \cdot \sin 0 \quad ---(1)$$

wherein $\alpha$ is the vertical angle of the dispersion prism 1, and n is the refractive index ratio; i.e., ($n_2/n_1$). For instance, in the case where the vertical angle $\alpha$ is 60°, then sin $$\psi = (1/2)(3\overline{(n^2 - \sin^2\theta)}) \sin \theta \quad ---(2).$$

As the refractive index of the dispersion prism 1 is increased with the voltage, the emergent angle $\psi$ is also increased.

The transmitted light beam emerging from the dispersion prism 1 is reflected by a reflecting mirror 5, so that it is applied through one of optical fibers 6-1 through 6-n arranged in the form of an array to a detector, namely, a streak camera 7.

Figure 3:
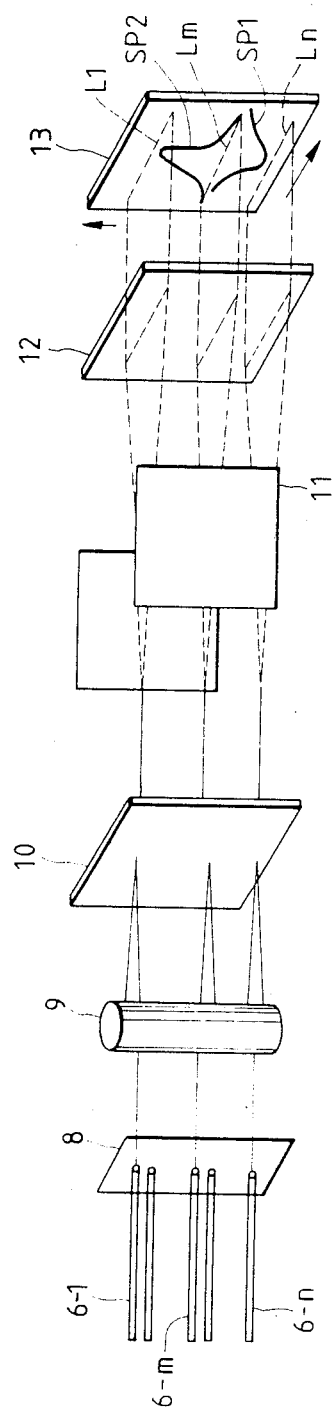
FIG. 3 is an explanatory diagram showing the arrangement of a streak camera used in the device of FIG. 1.

The streak camera 7, as shown in FIG. 3, comprises a slit 8 for receiving the ends of the optical fibers 6-1 through 6-n, a photo cathode 10 on which the transmitted light beams are focused by a linear lens 9, a pair of deflecting electrodes 11 for deflecting horizontally the electron beams which are arranged in a line and are provided through photo-electric conversion by the photo cathode 10, a micro-channel plate 12 for subjecting the electron beams to multiplication, and a phosphor screen 13 to which the electron beams from the micro-channel plate 12 are applied. In FIG. 3, the micro-channel plate 12 and the phosphor screen 13 are shown separated from each other; however, in practice, they are joined together. Furthermore, the lens 9, which is shown in FIG. 3 to be cylindrical, need not in practice, be cylindrical.

In the streak camera thus constructed, a saw tooth voltage may be applied to the deflecting electrodes 11, as a result of which the transmitted light beams arranged in a line which are applied in a time series manner to the photo cathode 10 are caused to sweep the phosphor screen 13 horizontally. Therefore, with the horizontal direction (or the sweep direction) as the time axis and with the vertical direction as the voltage axis, the variation of voltage of the predetermined part of the object under measurement can be observed as a voltage waveform on the phosphor screen 13.

In the case when no voltage is applied to the dispersion prism, the incident light beams to the dispersion prism 1 advance along an optical path T1 (FIG. 1) in the prism 1, and emerge, as transmitted light beams. The transmitted light beam is reflected by the mirror 5 and is applied through the optical fiber 6-m to the photo cathode 10 of the streak camera 7, so that the electron beam from the photo cathode 10 is applied to a line Lm on the phosphor screen 13 of the streak camera 7.

When the voltage of the predetermined part of the object, for instance a positive voltage, is applied to the dispersion prism 1, the refractive index of the dispersion prism 1 of the electro-optical material is changed by the voltage. As a result, the light beam from the light source 53 advances along an optical path T2 (FIG. 1) in the prism 1 and emerges as a transmitted light beam. The transmitted light beam is reflected by the mirror 5 so that it is applied through the optical fiber 6-n to the streak camera 7. As a result, the electron beam is applied to a line Ln on the phosphor screen 13 of the streak camera 7.

When a negative voltage is applied to the dispersion prism 1, the light beam from the light source 53 advances along an optical path T3 in the prism 1, and emerges, as a transmitted light beam. The transmitted light beam is reflected by the mirror 5 so that it is applied through the optical fiber 6-1 to the streak camera 7. As a result, the electron beam is applied to a line L1 on the phosphor screen 13, of the streak camera 17.

As is apparent from the above description, in the case where a positive voltage pulse is applied to a predetermined part of an object under measurement, the voltage is first zero and the light beam is transmitted over the optical fiber 6-m and is applied to the line Lm on the phosphor screen 13. As the voltage becomes positive, the electron beam resulting from the light beam transmitted over the optical fiber 6-n is applied to the line Ln on the phosphor screen 13. When the voltage becomes zero again, the electron beam resulting from the transmitted light beam over the optical fiber 6-m is applied to the line Lm on the phosphor screen 13. The streak image SP1 is the waveform occurring when a positive voltage pulse is applied to the predetermined area of the object under measurement when the direction of sweep by the deflection electrode, namely, the horizontal direction of the phosphor screen 13 is the time axis and the vertical direction of the phosphor screen 13 is the voltage axis.

When a negative voltage pulse is applied to the predetermined part of the object under measurement, the electron beam is applied to the lines Lm, Ll and Ln on the phosphor screen 13 in the stated order, as a result of which a streak image SP2, opposite in polarity to the above-described streak image SP1, is displayed on the phosphor screen 13. In this manner, the waveform of the negative voltage pulse is detected.

As is apparent from the above description, the voltage detecting device can detect not only the waveform of a voltage but also the polarity thereof because the refractive index of the dispersion prism 1 is changed by a voltage applied to a predetermined part of an object under measurement to cause the optical path of the transmitted light beam to be changed.

Furthermore, in the voltage detecting device of the present invention, it is unnecessary to extract only a light beam having a predetermined polarization component; i.e., a linearly polarized light beam. Therefore, the voltage detecting device is so high in the utilization of light that the transmitted light beam is substantially equal in intensity to the light beam outputted by the light source 53 and can be applied to the streak camera 7 at that high level. Moreover, the number of components in the optical system can be reduced. In addition, the voltage detection accuracy and sensitivity, and the waveform contrast when a voltage is detected in the form of a voltage waveform can be remarkably improved.

Figure 4:
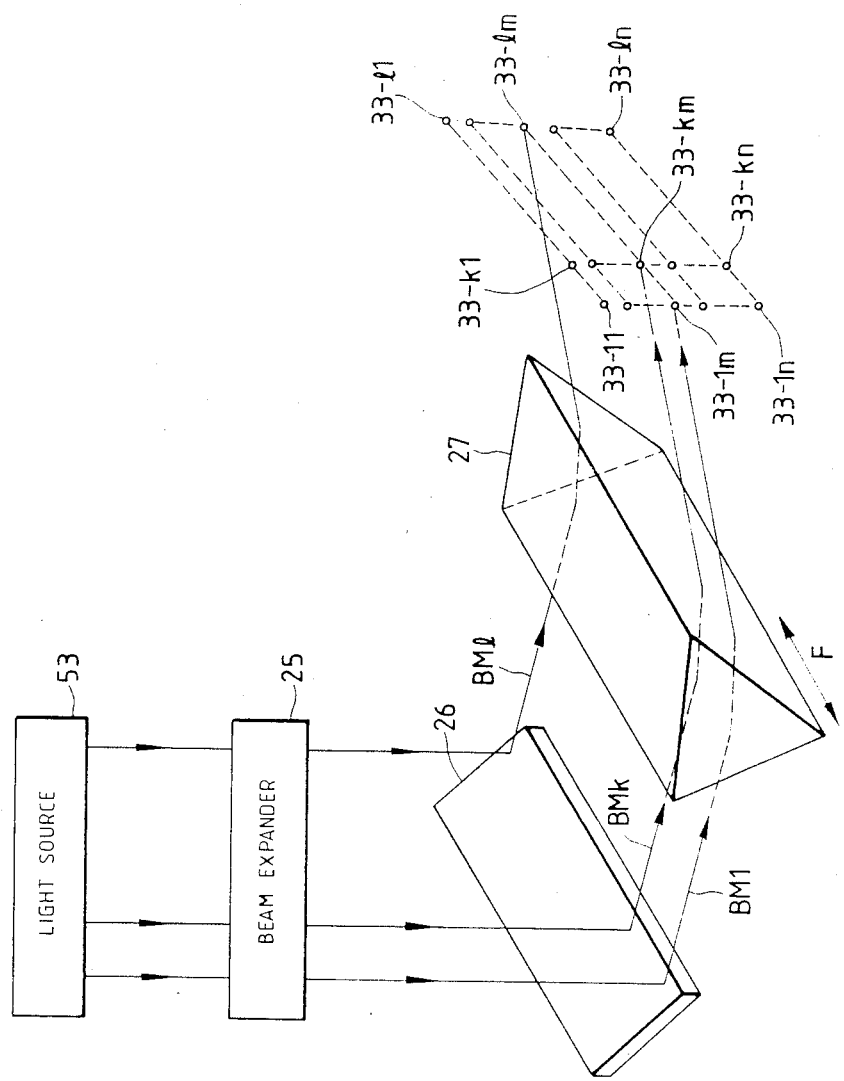
FIG. 4 is an explanatory diagram showing the arrangement of one modification of the voltage detecting device shown in FIG. 1.
Figure 5:
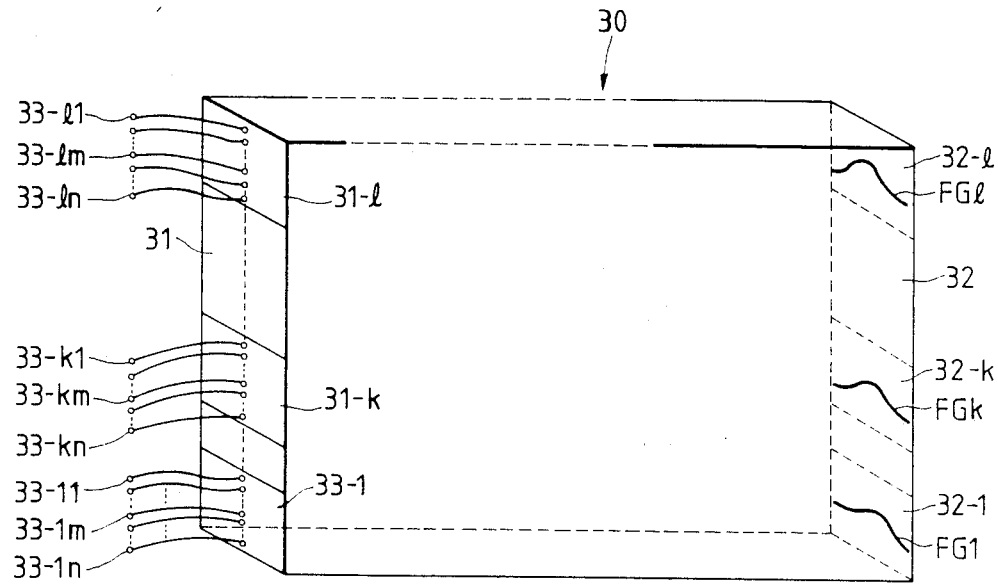
FIG. 5 is an explanatory diagram showing the arrangement of a two-dimensional detector, namely, a streak camera used in the device of FIG. 4.

FIGS. 4 and 5 are diagrams showing the arrangement of one modification of the voltage detecting device shown in FIG. 1. In the voltage detecting device of FIGS. 4 and 5, a light beam outputted by a light source 53 is converted into parallel light beams by a beam expander 25 which are applied through a mirror 26 to a dispersion prism 27. The parallel light beams BMl,...... BMk,..... and BMl applied to the dispersion prism 27 emerge from the latter advancing along optical paths defined by the refractive indexes of the dispersion prism 27 which correspond to the voltages of respective one-dimensional parts of an object under measurement which are arranged along the axis F. More specifically, because of the refractive index variation of the dispersion prism 27, the light beam BMl is applied to one of nodes 33-11,..... 33-lm,..... and 33-ln; the light beam BMk is applied to one of nodes 33-kl,....., 33-km,... and 33 kn; and the light beam BMl is applied to one of nodes 33-11,......, 33-lm,... and 33-ln.

In the voltage detecting device, the streak camera 30 is a two-dimensional detector as shown in FIG. 5. The streak camera has a slit 31 comprising a plurality of slit parts 31-1,......, 31-k,.... and 31-1. The light beams BMl applied to one of the nodes 33-11,...., 33-lm,.... and 33-ln is applied through an optical fiber to the slit part 31-1. The light beam BMk applied to one of the nodes 33-kl,...., 33-km,... and 33-kn is applied through an optical fiber to the slit part 31-k. The light beam BMl applied to one of the nodes 33-11,......, 33-ln, --- and 33-1n is applied through an optical fiber to the slit part 31-1. The streak camera 30 further comprises a fluorescent surface 32 including a plurality of surface parts 32-1,...., 32-k,---- and 32-1 in correspondence to the slit parts 31-1,...., 31 k,..... and 31-1.

In the voltage detecting device thus constructed, as the voltage of the object under measurement changes along the axis F, the refractive indexes of the parts of the dispersion prism 27 which correspond to the positions on the object, are changed. The light beams BMl,...., BMk,... and BMl emerge from the prism with changed optical paths. These light beams are observed with the streak camera 30; which is a two dimensional detector. In this case, the variation with time of the optical path of the light beam BMl is observed as a streak image FGl on the part 32-1 of the fluorescent surface 32; the variation of time of the optical path of the light beam BMk is observed as a streak image FGk on the part 32-k of the fluorescent surface 32; and the variation with time of the optical path of the light beam BMl is observed as a streak image FGl on the part 31-1 of the fluorescent surface 32. Thus, the voltages of the one-dimensional parts of the object can be detected simultaneously.

Figure 6:
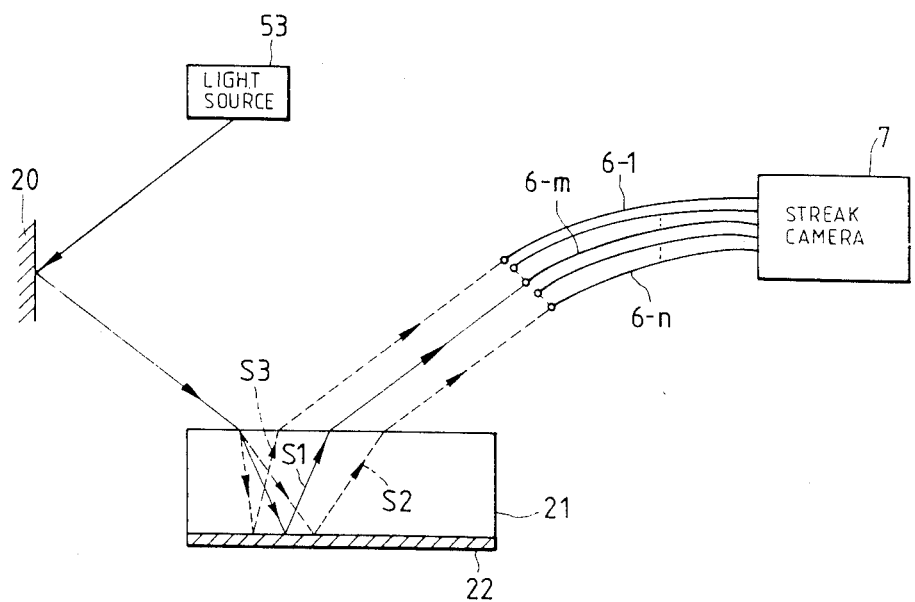
FIG. 6 is an explanatory diagram showing a second example of the voltage detecting device according to the present invention.

FIG. 6 is an explanatory diagram showing an arrangement of a second example of the voltage detecting device according to the present invention. The voltage detecting device of FIG. 6, like the device of FIG. 1, comprises a light source 53 (CW laser), a plurality of optical fibers 6-1 through 6-n, and a streak camera 7. However, the device of FIG. 6 is different from that of FIG. 1 in that the light beam outputted by the liqht source 53 is applied through a mirror 20 to an optically uniaxial crystal electro-optical material 21 with a reflecting mirror 22 made of a metal film or dielectric multi-layer film. The applied light beam is reflected by the mirror 22 so that it is applied, as an emergent light beam, from the electro-optical material 21 to one of the optical fibers 6-1 through 6-n.

In the voltage detecting device thus organized, when no voltage is applied to the electro-optical material 21, the output light beam of the light source 53 advances along an optical path Sl in the electro-optical material 21, and emerges, as a reflected light beam, from the material 21. The reflected light beam is applied to the optical fiber 6-m. When a positive (or negative) voltage is applied to the electro optical material 21, the output light beam of the light source 53 advances along an optical path S3 (or S2) in the electro-optical material 21, and emerges, as a reflected light beam. The reflected light beam is applied to the optical fiber 6-1 (or 6-n). That is, as the voltage applied to the electro-optical material 21 changes, the optical path of the light beam in the electro-optical material 21 is switched, and the optical fiber for transmitting the light beam to the streak camera is also switched.

Thus, as in the case of the voltage detecting device of FIG. 1, the voltage detecting device of FIG. 6 can detect not only the waveform but also the polarity of a voltage pulse or the like which is applied to a predetermined part of an object under measurement. The device does not require a polarizer, analyzer and beam splitter, and therefore has significantly fewer components than the conventional voltage detecting device. Thus, the device of the invention is high in the utility of light. Accordingly, the voltage detection accuracy and sensitivity can be remarkably improved.

Figure 7:
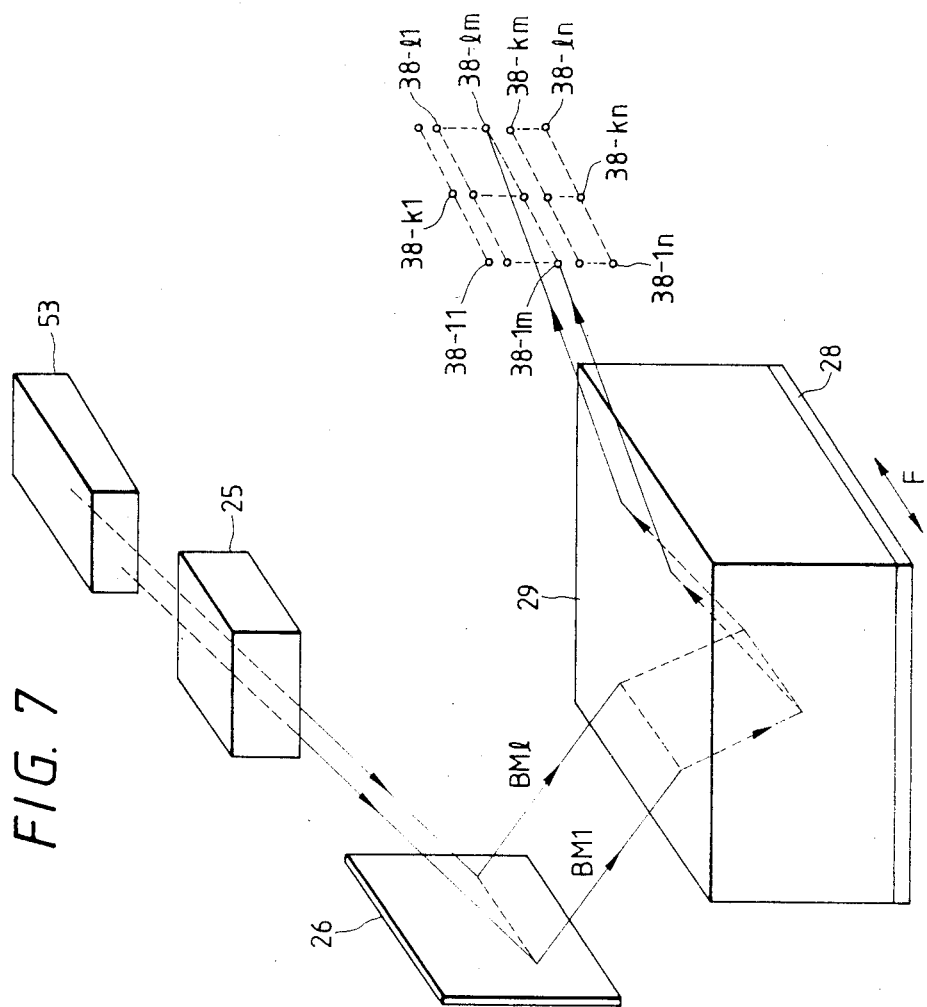
FIG. 7 is an explanatory diagram showing an arrangement of a part of a modification of the voltage detecting device shown in FIG. 6.

FIG. 7 is an explanatory diagram showing a modification of the voltage detecting device shown in FIG. 6. In the device of FIG. 7, a light beam outputted by a light source 53 is converted into parallel light beams by a beam expander 25, and the parallel light beams are applied through a mirror 26 to an optically uniaxial crystal electro-optical material 29 having a reflecting mirror 28 made of a metal film or a dielectric multilayer film. The parallel beams BM1 through BM1 applied to the electro-optical material 29 emerge from the material 29 and advance along optical paths defined by the refractive indexes of the electro optical material 29 which correspond to the voltages of one-dimensional parts of an object under measurement, and are arranged along the axis F. That is, because of the refractive index variation of the electro-optical material, light beam BM1 is applied to one of nodes 28-11 through 38-ln, and light beam BM1 is applied to one of nodes 38-11 through 38-ln.

In the voltage detecting device thus constructed, a streak camera as shown in FIG. 5 is employed as a two-dimensional detector so that the voltage variations corresponding to the optical paths of the light beams BM1 through BM1 are observed as streak images FG1 through FG1, respectively. Thus, as in the case of the voltage detecting device of FIGS. 4 and 5, the voltage detecting device of FIG. 7 can detect the voltages of one-dimensional parts of an object under measurement at the same time.

In the above-described embodiments of the invention, the dispersion prisms 1 and 27 and the electro-optical materials 21 and 29 are made of optically uniaxial crystal. They may, however, be made of isotropic crystal because the variation in polarization of a light beam is not utilized in the devices at all.

In the above-described embodiments, the emergent light beams are applied through the optical fibers to the streak camera; however, they may be applied to the slit 8 of the streak camera 7 directly without using the optical fibers. The invention has been described with reference to the case where the end portion of the electro-optical material is kept away from an object under measurement; however, it may be brought into contact with the object.

As was described above, in the voltage detecting device of the invention, the output light beam of the light source is allowed to advance along the optical path defined by the refractive index of the optical path changing means and to emerge therefrom as an emergent light beam. The emergent light beam is detected by the detecting means. Therefore, the device of the invention can directly detect the polarity as well as the waveform of a voltage pulse or the like which is applied to a predetermined part of an object under measurement. In addition, the number of components in the optical system is reduced, and the emergent light beam can be detected with the light beam from the light source being maintained substantially unchanged in intensity. Thus, the voltage detecting device of the invention can detect a voltage with high accuracy and with high sensitivity which is applied to a predetermined part of an object under measurement.

What is claimed is:

1. A voltage detecting device for detecting and measuring a voltage at a predetermined part of an object under measurement, comprising:
   a light source for outputting a light beam;
   optical path changing means adapted to be placed closely spaced to the predetermined part of the object, said optical path changing means being made of electro-optical material having a refractive index that is changed by the presence of a voltage, said optical path changing means for allowing said light beam outputted by said light source to advance along an optical path corresponding to the refractive index of said electro-optical material;
   means for detecting said light beam upon emergence of the light from said optical path changing means and for displaying in response to said detected light beam an image indicating the voltage at the predetermined part of the object; and
   guiding means for conveying said light beam from said optical path changing means to said detecting means.

2. A voltage detecting device according to claim 1, wherein said optical path changing means includes an incident surface for receiving said light beam and an emergence surface, said optical path changing means for causing a light beam incident on said incident surface to be transmitted along an optical path corresponding to the refractive index of said electro-optical material and to emerge as a transmitted light beam from said emergence surface.

3. A voltage detecting device according to claim 2, wherein said optical path changing means comprises a dispersion prism.

4. A voltage detecting device according to claim 3, wherein said electro-optical material comprises an optically uni-axial crystal of lithium tantalate.

5. A voltage detecting device according to claim 1, wherein said guiding means comprises a plurality of optical fibers, each of said optical fibers adapted to receive said transmitted light beam for a different range of refractive index of said electro-optical material.

6. A voltage detecting device according to claim 1, wherein said detecting and displaying means comprises a streak camera, said streak camera including a phosphor screen for displaying a voltage waveform, said voltage waveform indicating the variation over time of the voltage at the predetermined part of the object.

7. A voltage detecting device according to claim 1, wherein said optical path changing means includes an incident surface for receiving said light beam, a reflection surface, and an emergence surface, said optical path changing means for causing a light beam incident on said incident surface to be transmitted along an optical path corresponding to the refractive index of said electro-optical material, to be reflected by said reflection surface, and to emerge as a transmitted light beam from said emergence surface.

8. A voltage detecting device according to claim 7, wherein said electro-optical material comprises an optically uni-axial crystal of lithium tantalate.

9. A voltage detecting device for detecting and measuring a voltage at a predetermined part of an object under measurement, comprising:
- a light source for outputting a light beam;
- a beam expander for converting said light beam into a plurality of parallel light beams;
- optical path changing means adapted to be placed closely spaced to the predetermined part of the object, said optical path changing means being made of electro-optical material having a refractive index that is changed by the presence of a voltage, said optical path changing means for allowing said parallel light beams outputted by said beam expander to advance along optical paths corresponding to the refractive index of respective portions of said electric-optical material;
- means for detecting said parallel light beams upon emergence thereof from said optical path changing means and for displaying in response to said detected parallel light beams a plurality of images, each of said images indicating the voltage over time at respective portions of the predetermined part of the object; and
- guiding means for conveying said parallel light beams from said optical path changing means to said detecting means.

10. A voltage detecting device according to claim 9, wherein said detecting and displaying means comprises streak camera means for displaying a plurality of voltage waveforms, each of said voltage waveforms indicating the variation over time of the voltage as said respective portions of the predetermined part of the object.

* * * * *